United States Patent [19]

Kataoka et al.

[11] 4,013,975
[45] Mar. 22, 1977

[54] VARIABLE RESISTANCE CIRCUIT

[75] Inventors: Koji Kataoka; Hisayuki Uchiike, both of Musashino, Japan

[73] Assignee: Kabushikikaisha Yokogawa Denki Seisakusho, Tokyo, Japan

[22] Filed: Mar. 26, 1976

[21] Appl. No.: 670,673

[30] Foreign Application Priority Data

Mar. 31, 1975 Japan .............................. 50-38758
Mar. 31, 1975 Japan .............................. 50-38759

[52] U.S. Cl. ................................ 330/145; 307/237; 328/171; 328/172; 330/86

[51] Int. Cl.² ................... H03G 11/00; H03G 3/12; H03G 3/18; H03F 3/16

[58] Field of Search .......... 307/237, 264, 251, 304; 328/168, 169, 171, 172, 173, 175; 330/29, 144, 145, 86, 95

[56] References Cited

UNITED STATES PATENTS

| 3,177,350 | 4/1965 | Abbott et al. | 330/144 X |
|---|---|---|---|
| 3,539,936 | 11/1970 | McGhee | 330/86 X |
| 3,544,812 | 12/1970 | Riso | 307/304 X |
| 3,629,720 | 12/1971 | Sedra et al. | 330/145 X |
| 3,631,262 | 12/1971 | Jarrett | 330/145 X |
| 3,652,791 | 3/1972 | Sheuy | 330/29 X |
| 3,882,330 | 5/1975 | Galpin | 328/172 X |
| 3,918,003 | 11/1975 | Seidel | 330/145 X |

OTHER PUBLICATIONS

Macken, "F.E.T.s as Variable Resistances in Op. Amps and Gyrators"; Electronic Engrg.; 12/1972; pp. 60–61.

*Primary Examiner*—John S. Heyman
*Assistant Examiner*—Larry N. Anagnos
*Attorney, Agent, or Firm*—Moonray Kojima

[57] ABSTRACT

A variable resistance circuit comprising a field effect transistor, a plurality of amplifiers and a feedback circuit for one of the amplifiers with the equivalent resistance value derived from a circuit comprising the field effect transistor electrodes and a reference resistor being controlled by a digital signal or a pulse-width signal supplied to the feedback circuit.

10 Claims, 20 Drawing Figures

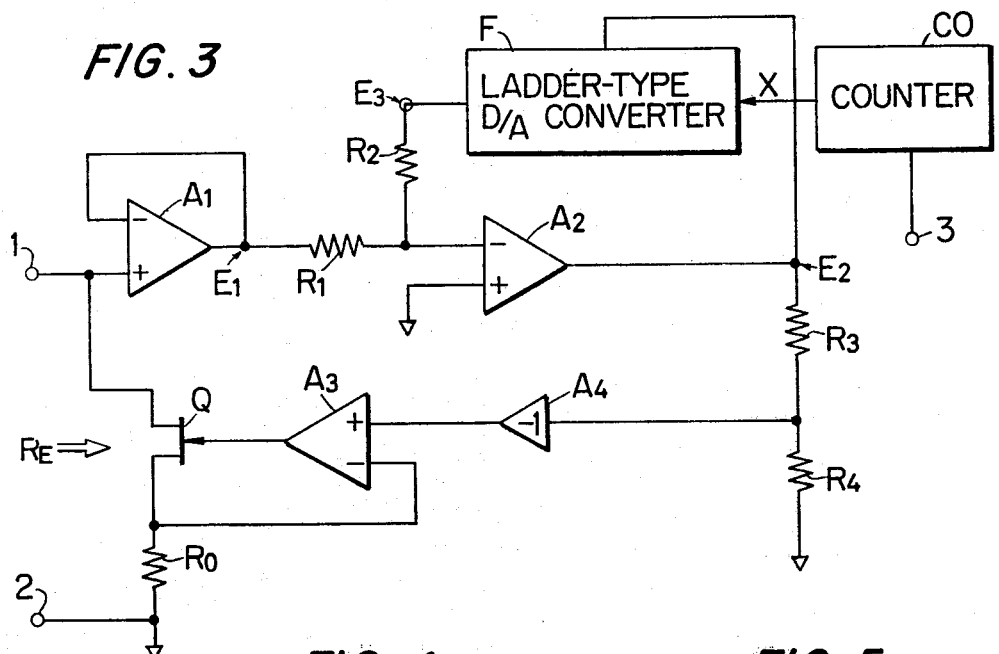
FIG. 3
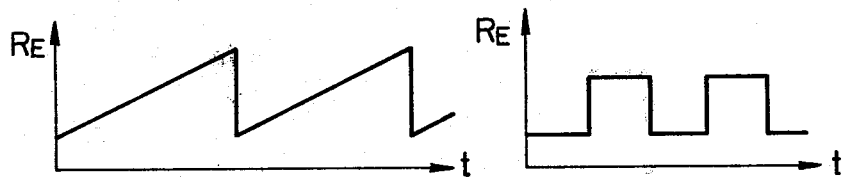
FIG. 4
FIG. 5
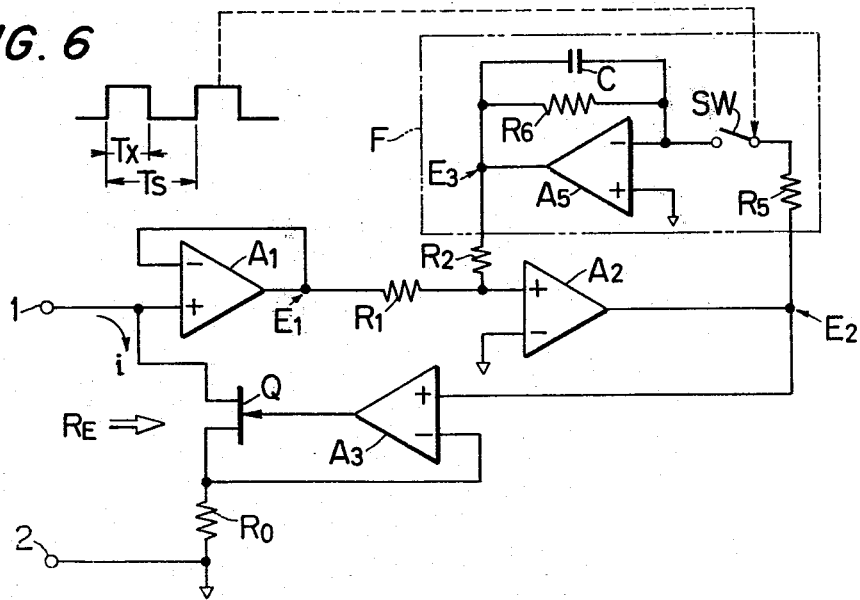
FIG. 6

VARIABLE RESISTANCE CIRCUIT

BACKGROUND OF THE INVENTION

1. Field of the Invention

This invention relates to variable resistance circuits comprising electronic circuits, and more particularly to variable resistance circuits controllable by a digital code signal or a pulse-width signal.

2. Description of the Prior Art

Prior art variable resistance circuits comprise a transistor or a field effect transistor (FET) with an equivalent resistance present between the collector and the emitter of the transistor or between the drain and the source electrodes of the FET, which is controlled by an input signal supplied to the base of the transistor or to the gate of the FET, whereby the resistance of the circuit is varied to a desired value. These prior art circuit leave much to be desired. The prior circuits simply utilize the characteristics of the transistor or FET, have a limited resistance-variable range and are incapable of offering a simple response (e.g. square characteristic response or 3/2-power characteristic response) to the control signal. Furthermore, the control signal is of an analog voltage or current and hence is not completely compatible with digital logic circuits.

SUMMARY OF THE INVENTION

An object of the invention is to provide a variable resistance circuit controllable by an input digital code signal or pulse-width signal.

Another object of the invention is to provide a variable resistance circuit capable of offering a linearly variable resistance value in response to an input control signal.

Another object of the invention is to provide a variable resistance circuit having a hyperbolic characteristic for an input control signal.

Another object of the invention is to provide a variable resistance circuit controllable by a digital signal or a pulse-width signal, operable over a wide range of variable resistances under application of large current, and capable of offering a simple, proportional or inversely proportional characteristic in response to an input control signal.

Another object of the invention is to provide a variable gain DC amplifier circuit controllable by a digital signal or a pulse width signal and capable of linearly or hyperbolically varying the gain over a wide range and in a simple characteristic in response to an input control signal.

To attain the foregoing and other objects, the invention provides a variable resistance circuit comprising a field effect transistor (FET), in which a loop circuit is controlled and the sum of an equivalent resistance present between the drain and source electrodes of the FET and a reference resistance connected serially to the source is advantageously utilized.

BRIEF DESCRIPTION OF THE DRAWING

FIGS. 2 and 3 depict circuit diagrams of further illustrative embodiments of the invention showing linear type variable resistance circuits controlled by a digital code signal;

FIGS. 4 and 5 depict diagrams of waveforms usefull for illustrating the operation of the embodiment of FIG. 3;

FIG. 6 depicts a circuit diagram of another illustrative embodiment of the invention showing a linear type variable resistance circuit controlled by a pulse-width signal;

DETAILED DESCRIPTION OF THE PREFERRED EMBODIMENTS.

Figure 1:
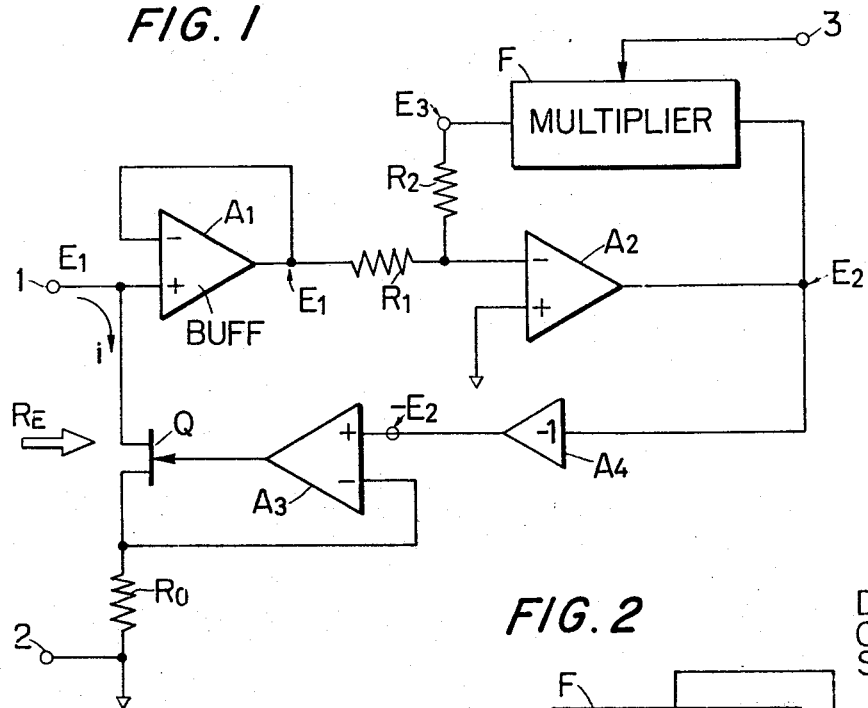
FIG. 1 depicts a circuit diagram of an illustrative embodiment of the invention showing a variable resistance circuit of the linear type.

With reference to FIG. 1, a variable resistance circuit of one embodiment of the invention is schematically shown, comprising terminals 1 and 2 through which a resistance value is supplied to the variable resistance circuit, an input signal terminal 3, amplifiers $A_1$, $A_2$, $A_3$ and $A_4$, a multiplier F, a field effect transistor (FET) Q, a reference resistor $R_0$, and resistors $R_1$ and $R_2$. The terminal 1 is led to amplifier $A_2$ through buffer amplifier $A_1$. Amplifier $A_2$ has a negative feedback circuit comprising multiplier F and resistor $R_2$. The output of amplifier $A_2$ is led to the positive input terminal of differential amplifier $A_3$ through reverse amplifier $A_4$. The output of amplifier $A_3$ is connected to the gate of FET Q. In this embodiment, the FET is of an N-channel type. The negative input terminal of amplifier $A_3$ is connected to the source of FET Q. The source electrode is connected to a common potential through reference resistor $R_0$. Multiplier F may function as an amplifier or an attenuator, to be capable of generating an output voltage from an input voltage at a multiplying factor X in a manner to be described hereinafter.

This variable resistance circuit operates in the following manner. Assume that a voltage is applied between terminals 1 and 2 thereby causing a current $i$ to flow. The equivalent resistance value $R_E$ as seen by terminals 1 and 2, is expressed as $$R_E = \frac{E_1}{i} \tag{1}$$

wherein $E_1$ denotes the voltage at terminal 1. Since amplifier $A_1$ is a buffer amplifier, its output voltage is also $E_1$. The voltage $E_3$ at the output terminal of multiplier F in the feedback circuit is given as follows when the output of amplifier $A_2$ is $E_2$.

$$E_3 = E_2 \cdot X \qquad (2)$$

wherein $X$ is the multiplying factor of multiplier F. The input impedance of amplifier $A_2$ is sufficiently high and hence the following conditions hold at the input terminal of amplifier $A_2$.

$$\frac{E_1}{R_1} = \frac{E_3}{R_2} = 0 \qquad (3)$$

The output of amplifier $A_4$ is $(-)E_2$ since this amplifier is an inverse (or sometimes also called reverse) amplifier. Differential amplifier $A_3$ has a sufficiently large gain and virtually no current flows in the gate of the FET. Thus, at both of the input terminals of amplifier $A_3$, $$iR_o = -E_2 \qquad (4)$$

Then, by substituting equations (2), (3) and (4), for equation (1), the equivalent resistance value $R_E$ is $$R_E = \frac{R_1}{R_2} \cdot R_o \cdot X \qquad (5)$$

As indicated by equation (5), the equivalent resistance value is proportional to the variable X in the circuit of the illustrative embodiment of the invention as depicted in FIG. 1.

Figure 2:
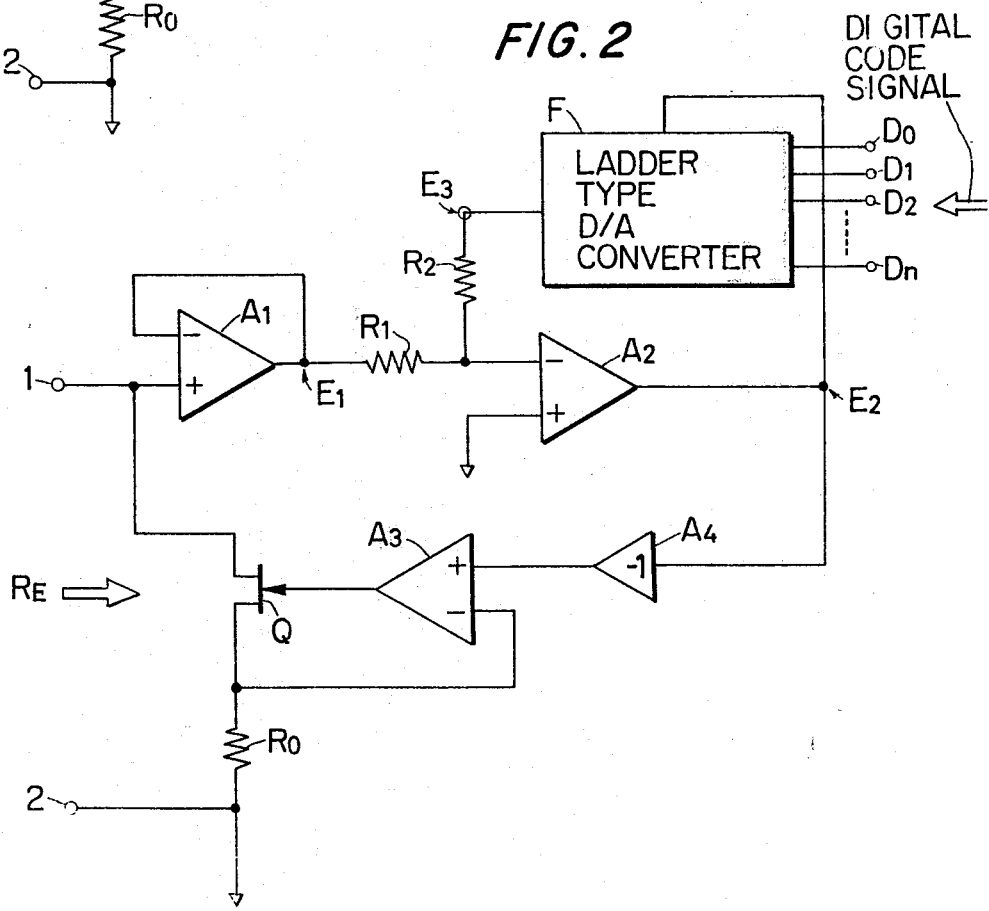

Referring to FIG. 2, another variable resistance circuit of the invention is schematically shown. In this example, the multiplier F is controlled by a digital code signal. The multiplier F is of a ladder type digital-to-analog converter such as, for example, AD7520 sold by Analog Device Company, Inc. The input-output voltage ratio is controlled by a digital code signal. From equation (5), the variable X is expressed as $$X = \tfrac{1}{2}(D_o \cdot 2^0 + D_1 \cdot 2^{-1} = \ldots + D_n 2^{-n}) \qquad (6)$$

wherein $D_o, D_1, \ldots D_n$ denote digital code (0 or 1) trains.

Referring to FIG. 3, another variable resistance circuit of the invention is schematically shown. In FIG. 3, the multiplier F is controlled by the output of a counter CO. Thus, a resistance value $R_E$ (varied as shown by the waveforms in FIGS. 4 or 5) is obtained. More specifically, the output voltage of amplifier $A_2$ is divided through resistors $R_3$ and $R_4$ and applied to amplifier $A_3$. By suitably determining the values of $R_3$ and $R_4$, the range of resistance to be varied can be selectively determined. In this embodiment, the equivalent resistance value $R_E$ is given as $$R_E = \frac{R_1}{R_2} \cdot R_o \cdot \frac{R_3 + R_4}{R_4} \cdot X \qquad (7)$$

With reference to FIG. 6, another variable resistance circuit of the invention is schematically shown. In FIG. 6, a holding circuit comprising an amplifier $A_5$ is used as multiplier F and is switched by switch SW. The switch SW is controlled by a pulse-width signal whose period is Ts and duty is Tx, permitting the equivalent value $R_E$ to be varied by a pulse-width signal. The multiplying factor X of the multiplier F is $$X = \frac{R_6}{R_5} \cdot \frac{T_x}{T_s} \qquad (8)$$

Therefore, from equation (5), $$R_E = \frac{R_1}{R_2} \cdot R_o \cdot \frac{R_6}{R_5} \cdot \frac{T_x}{T_s} \qquad (9)$$

For the purpose of this embodiment, an attenuator may be used as the multiplier F and controlled by a pulse width signal.

As described above, the variable resistance circuit of the invention is capable of offering a wider range of variable resistance than available with the equivalent resistance characteristic between the drain and the source of a single FET with the resistance being variable linearly. This variable resistance circuit is useful particularly in compensating for the resistance of various measuring instruments.

Figure 7:
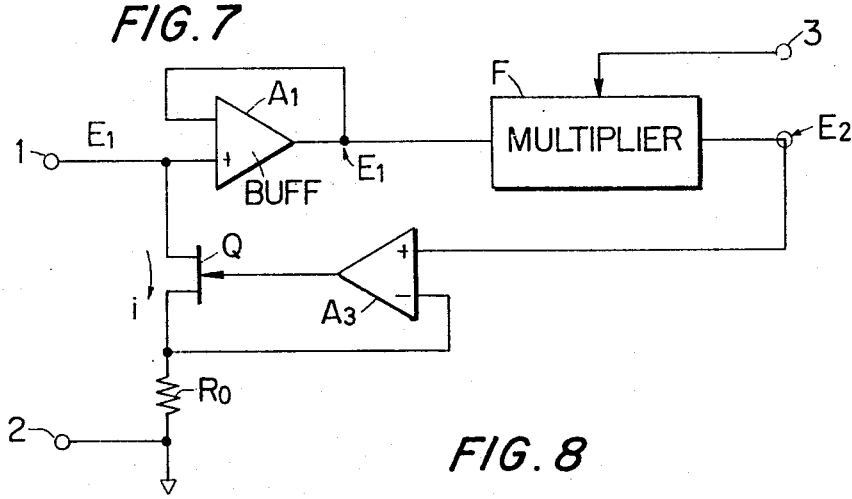
FIG. 7 depicts a circuit diagram of a further illustrative embodiment of the invention showing a variable resistance circuit of the hyperbolic type.

With reference to FIG. 7, another embodiment of the invention is schematically shown. In FIG. 7, multiplier F is connected between amplifier $A_1$ and $A_3$ is a simpler arrangement than the one shown in FIG. 1. Other circuit elements are the same as those in FIG. 1. This circuit operates in the following manner. A voltage is applied between terminals 1 and 2 thereby causing a current $i$ to flow therein. The equivalent resistance value $R_E$ seen by terminals 1 and 2 is given as $$R_E = \frac{E_1}{i} \qquad (10)$$

wherein $E_1$ is the voltage at terminal 1. The output of amplifier $A_1$ is also $E_1$ since this amplifier is a buffer amplifier. The voltage at the output terminal of multiplier F is $$E_2 = E_1 \cdot X \qquad (11)$$

wherein X is the multiplying factor of multiplier F. The amplifier $A_3$ is a differential type amplifier and has a large feedback capacity and hence virtually no current flows in the gate of the FET Q. Thus, the following condition holds at both the input terminals of amplifier '$A_3$, $$iR_o = E_2 \qquad (12)$$

substituting equations (11) and (12) for equation (10), $$R_E = \frac{R_o}{X} \qquad (13)$$

In this variable resistance circuit, therefore, the equivalent resistance value $R_E$ varies inversely with the variable X.

Figure 8:
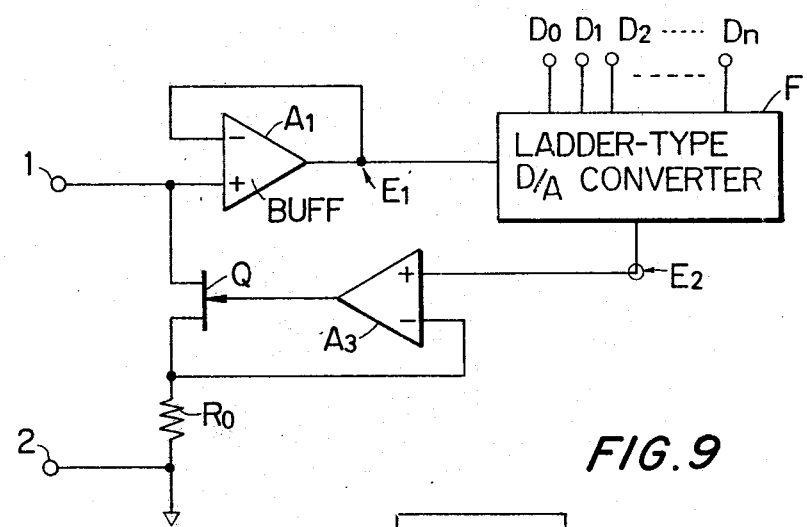
FIGS. 8 and 9 depict circuit diagrams of other illustrative embodiments of the invention showing hyperbolic type variable resistance circuits controlled by a digital code signal.

Another embodiment of the invention is schematically shown in FIG. 8 wherein multiplier F is controlled by a digital code signal. This multiplier is of the foregoing ladder type digital-to-analog converter, of which the input-output voltage ratio is controlled by a digital code signal. From equation (4), the variable X may be expressed as $$X = \frac{1}{2}(D_0 2^0 + D_1 2^{-1} + \ldots + D_n 2^{-n}) \quad (14)$$

wherein, $D_0, D_1 \ldots D_n$ denote digital code trains.

Figure 9:
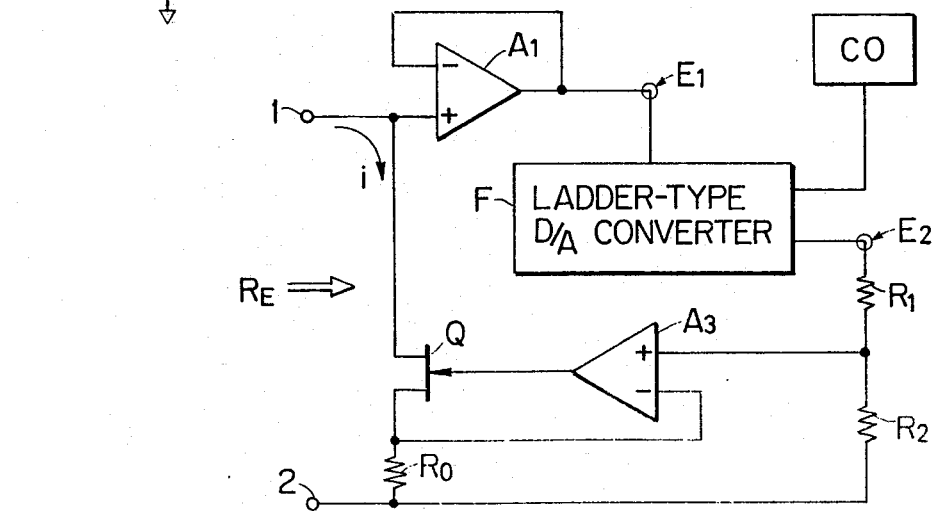
Figure 10:
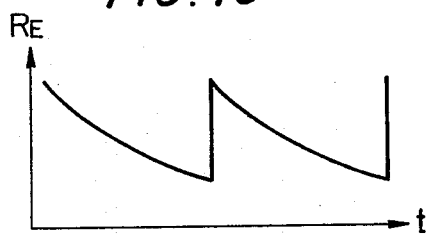
FIGS. 10 and 11 depict diagrams of waveforms useful for illustrating the operation of the embodiment of FIG. 9.
Figure 11:
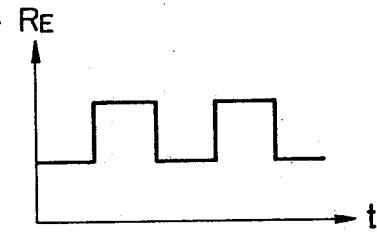

Another embodiment of the invention is schematically shown in FIG. 9 wherein multiplier F is controlled by the output of a counter CO. In this embodiment, a variable resistance value (as shown in FIGS. 10 and 11) is realized. (FIGS. 10 and 11 are waveforms showing how the resistance value varies with time).

In this example, the output voltage of multiplier F is divided through resistors $R_1$ and $R_2$ and then supplied to amplifier $A_3$. By suitably determining the values of $R_1$ and $R_2$, the range of variable resistance can be selectively determined. The equivalent resistance value $R_E$ is $$R_E = R_o \cdot \frac{R_1 + R_2}{R_2} \cdot \frac{1}{X} \quad (15)$$

Figure 12:
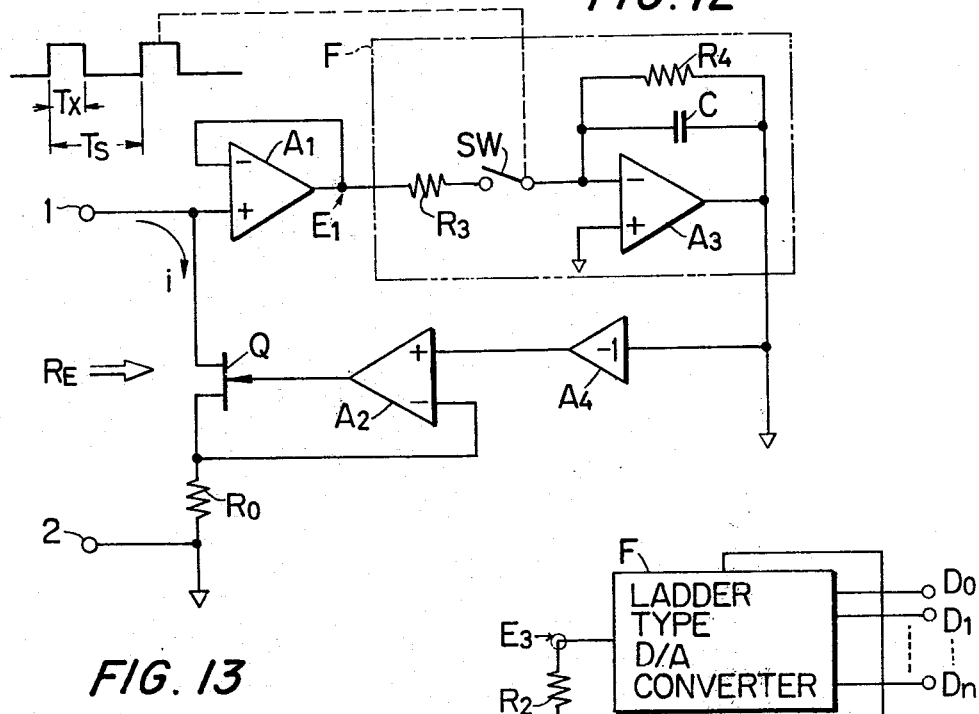
FIG. 12 depicts a circuit diagram of a further illustrative embodiment of the invention showing a hyperbolic type variable resistance circuit controlled by a pulse-width signal.

Another embodiment of the invention is schematically shown in FIG. 12 wherein multiplier F is an integrator using an amplifier $A_3$ to control the switch SW. Switch SW is controlled by a pulse-width signal (of which the period is Ts and the duty is Tx) whereby the resistance value $R_E$ is varied by such pulse-width signal. The multiplying factor X of the multiplier F is $$X = \frac{R_4}{R_3} \cdot \frac{T_x}{T_s} \quad (16)$$

From equation (4), the equivalent resistance value $R_E$ is $$R_E = R_o \cdot \frac{R_3}{R_4} \cdot \frac{T_s}{T_x} \quad (17)$$

In this circuit, the input and the output of multiplier F are reverse in polarity to each other. For this reason, an inverse or reverse amplifier $A_4$ is used after multiplier F.

Multiplier F may be an attenuator, which is controlled by a pulse-width signal.

Thus, the variable resistance circuit of the invention offers a wider range of variable resistance than available with the equivalent resistance characteristic present between the drain and the source of a single FET, the resistance being varied hyperbolically in response to an input signal. The variable resistance circuit is useful particularly in providing a resistance for the feedback circuit of an operational amplifier or in compensating for the resistance of various measuring instruments.

There may be numerous variations and modifications of the disclosed embodiments of the invention. For example, the buffer amplifier, the inverse or reverse amplifier or the attenuator may be inserted into the current path of the circuit or replaced with each other or removed according to the application desired and wherein the input polarity of the amplifier $A_2$ should be properly determined. In the above examples, the FET is of an N-channel type. In its place, an FET of a P-channel type, enhancement type or depletion type may be used. Also, the source and drain electrodes of the FET may be reversely connected. In such case, the input polarity of the amplifier $A_3$ should be properly selected.

Figure 13:
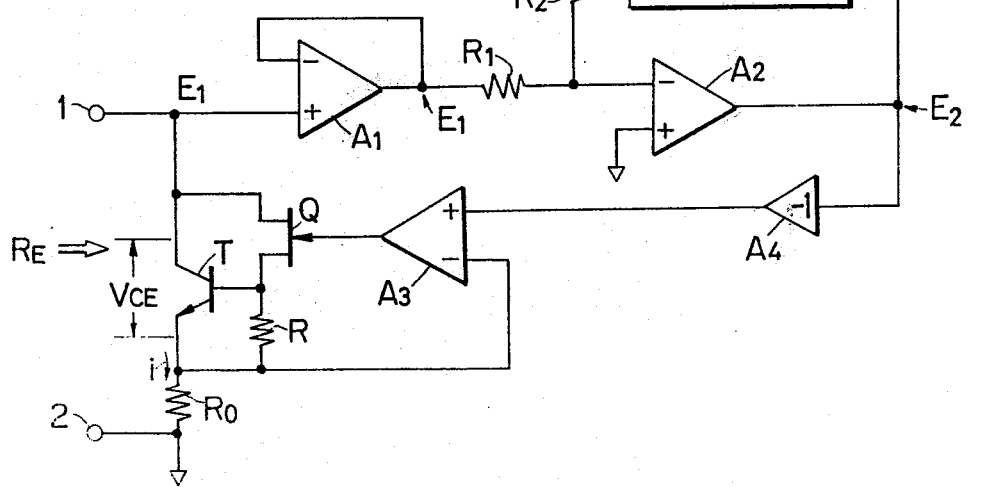
FIGS. 13 and 14 depict circuit diagrams of illustrative embodiments of the invention showing linear type variable resistance circuits of large current capacity.

An exemplary application of the circuit of the invention is schematically shown in FIG. 13. This circuit is similar to the one shown in FIG. 2, except for the use of an additional transistor T. This circuits operates on the same principle as the one in FIG. 2. The equivalent resistance value $R_E$ as seen by the terminals 1 and 2 is expressed as $$R_E = \frac{E_1}{i} = \frac{R_o}{2} \cdot \frac{R_1}{R_2}(D_0 2^0 + D_1 2^{-1} + \ldots + D_n 2^{-n}) \quad (18)$$

As apparent from equation (18), the equivalent resistance value $R_E$ is proportional to the applied digital control signal. By the use of a transistor of large current capacity, a variable resistance circuit for large current applications can be realized.

Figure 14:
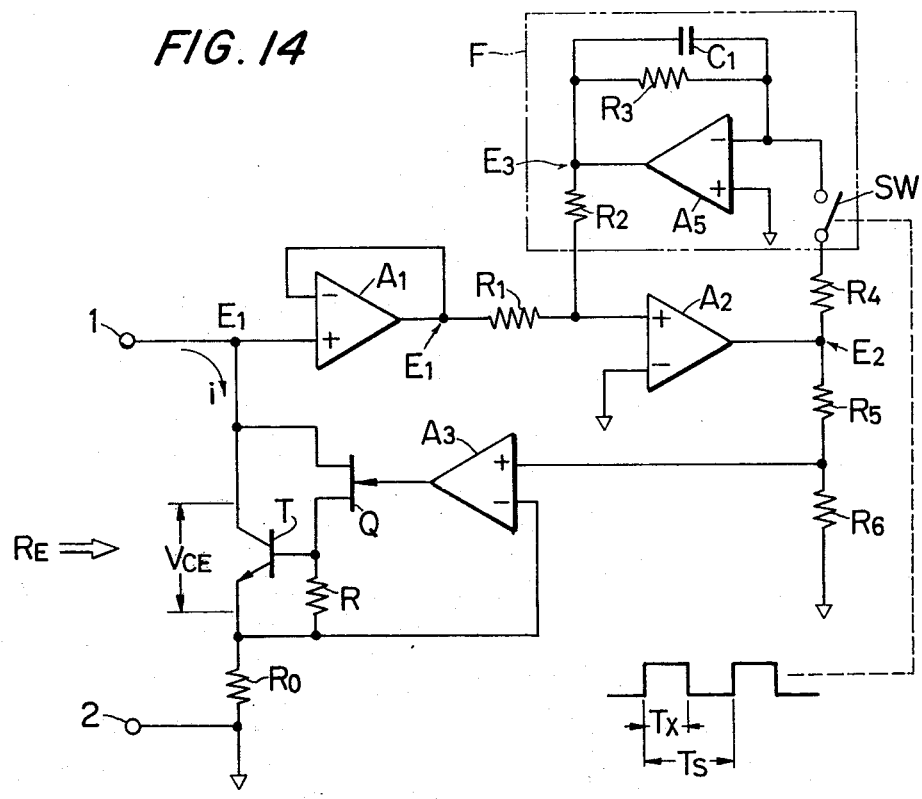

FIG. 14 schematically shows another embodiment of the invention in which the multiplier F is a holding circuit such as shown in FIG. 6, and the resistance vlaue is controlled by a pulse-width signal. The equivalent resistance value $R_E$ as seen by the terminals 1 and 2 is expressed as $$R_E = \frac{E_1}{i} = R_o \cdot \frac{R_1}{R_2} \cdot \frac{R_4}{R_3} \cdot \frac{R_5 + R_6}{R_6} \cdot \frac{T_x}{T_s} \quad (19)$$

Thus, the equivalent resistance value $R_E$ can be varied with the duty ratio Tx/Ts of a pulse-width control signal.

The variable range of $R_E$ can be selectively determined by suitably selecting the values of resistors $R_5$ and $R_6$. This resistance circuit may be disposed in a position of optimum use for various applications. According to the invention, a heat source having a linear or hyperbolic characteristic can be realized by utilizing the fact that transistors serve as a heat source. This concept is materialized on the following principles:

$$p = i^2 R_E \quad \text{(linearly)} \quad (20)$$

$$P = \frac{v^2}{R_E} \quad \text{(Hyperbolically)} \quad (21)$$

wherein
P = heat quantity
i = constant current value
v = constant voltage value.

Figure 15:
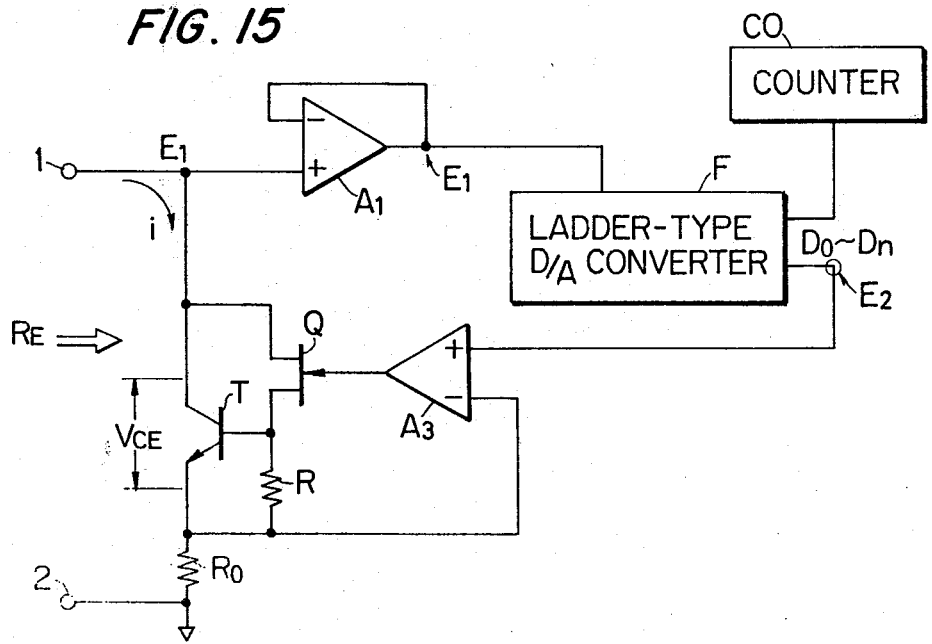
FIGS. 15 and 16 depict circuit diagrams of further illustrative embodiments of the invention showing hyperbolic type variable resistance circuits of large current capacity.
Figure 16:
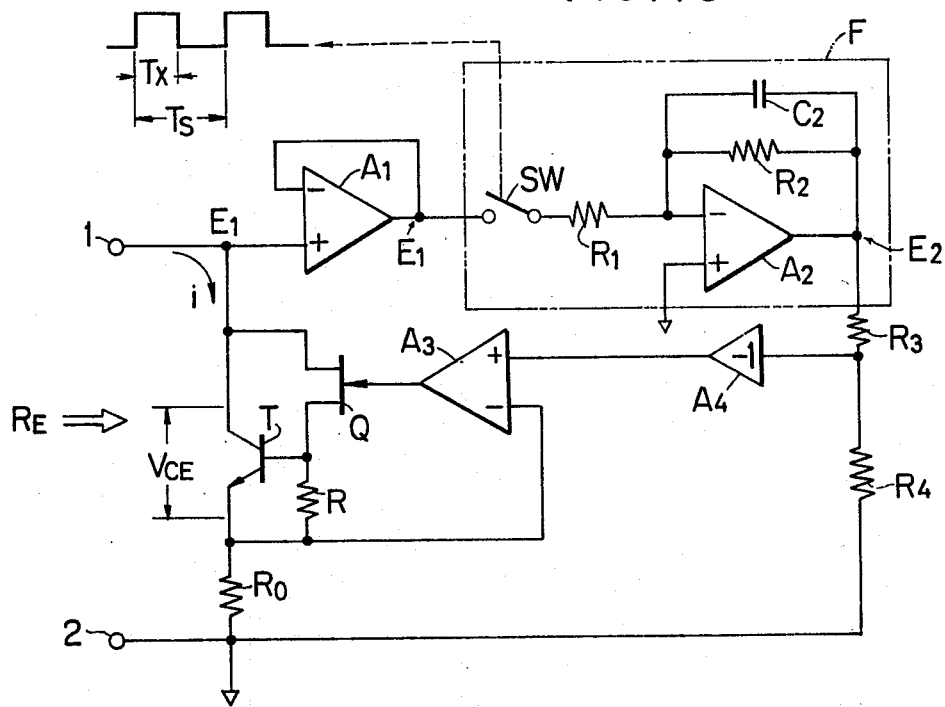

FIGS. 15 and 16 schematically show variable resistance circuits of the invention for large current applications. These circuits are modified from the circuits shown in FIGS. 9 and 12 respectively. The variable resistance characteristics are the same as those of the circuits shown in FIGS. 9 and 12. These circuits offer hyperbolic resistance characteristics in response to an input control digital code signal or pulse-width signal. In this circuit also, a transistor T may be used as a heat source of linear or hyperbolic characteristic in response to an input signal. The heat quantity P is give as $$p = i^2 R_E \quad \text{(hyperbolically)} \quad (22)$$

$$P = \frac{v^2}{R_E} \text{ (linearly)} \tag{23}$$

wherein
 $i$ = constant current value and
 $v$ = constant voltage value.

Figure 17:
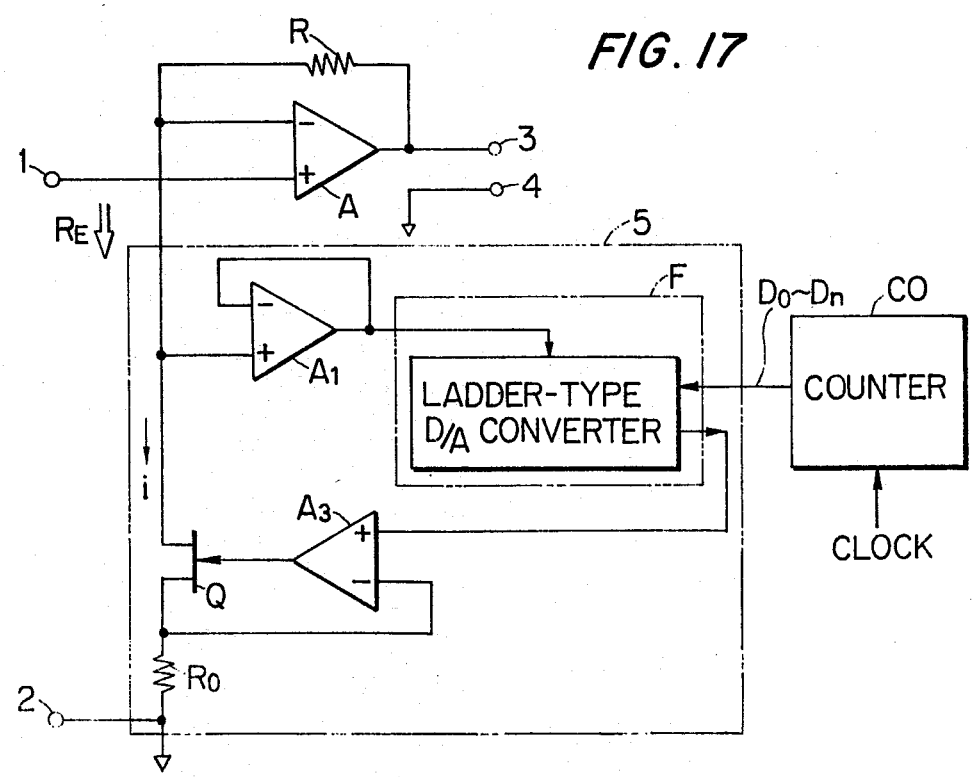
FIGS. 17 and 18 depict circuit diagrams of other illustrative embodiments of the invention showing linear type variable gain amplifiers.

The variable resistance circuit of the invention can be utilized as a variable gain amplifier circuit in the following manner. One example of a variable gain amplifier is schematically shown in FIG. 17. This circuit comprises input terminals 1 and 2, output terminals 3 and 4, and a variable resistance circuit 5 of the hyperbolic type similar to the one shown in FIG. 8. The input terminal 1 is connected to the positive one of the input terminals of a differential amplifier A, and the input terminal 2 is led to a common potential. The output of the amplifier A is led to the output terminal 13. The amplified output emerges between the output terminal 3 and terminal 4 connected to the common potential. A feedback circuit of resistance R is formed between the output and the negative input of the amplifier A, and a variable resistance circuit of equivalent resistance value $R_E$ is connected between the negative input and the amplifier A and the common potential. As well-known, the gain of the amplifier having its input led from terminals 1 and 2 and its outputs led to the terminals 3 and 4 depends upon the ratio of resistance R to $R_E$. From equations (13) and (14), the equivalent resistance value $R_E$ is $$R_E = \frac{2R_o}{(D_o 2^o + D_1 2^{-1} + \ldots + D_n 2^{-n})} \tag{24}$$

Therefore, the amplifier gain G is $$G = \frac{R}{R_E} = \frac{1}{2} \cdot \frac{R}{R_o} (D_o 2^o + D_1 2^{-1} + \ldots + D_n 2^{-n}) \tag{25}$$

Thus, this amplifier circuit makes available a gain which varies with the digital code signal applied thereto.

Figure 18:
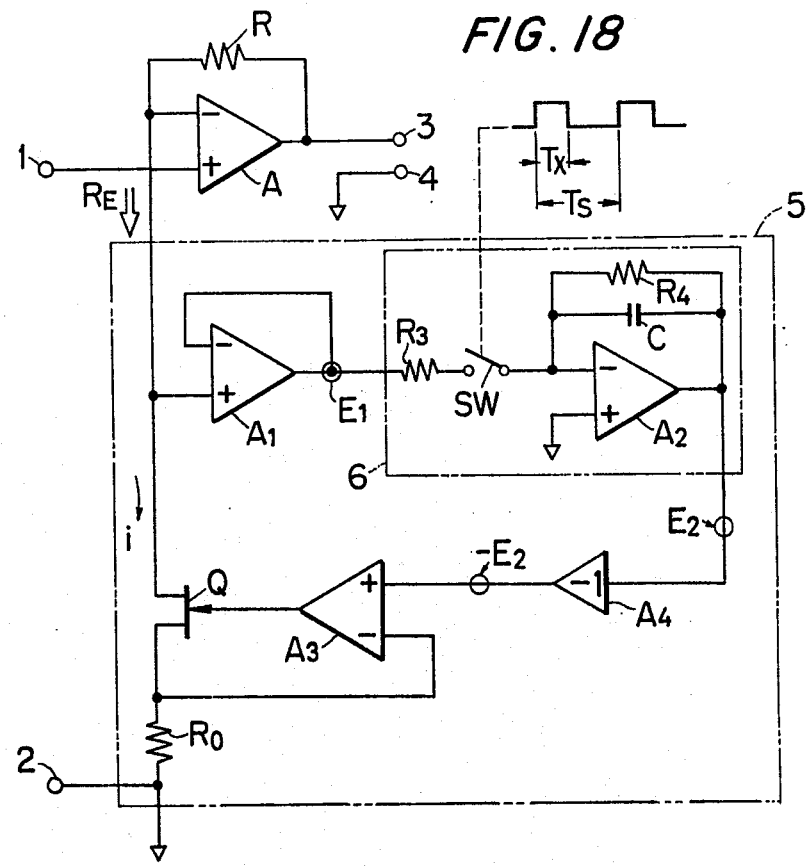

FIG. 18 schematically shows another variable gain amplifier circuit controlled by a pulse-width signal. The gain G of this amplifier is given as $$G = \frac{R}{R_E} = \frac{R \cdot R_4}{R_o \cdot R_3} \cdot \frac{Tx}{T_s} \tag{26}$$

Accordingly, the amplifier gain is proportional to the duty/width ratio Tx/Ts of a pulse width signal applied thereto.

Figure 19:
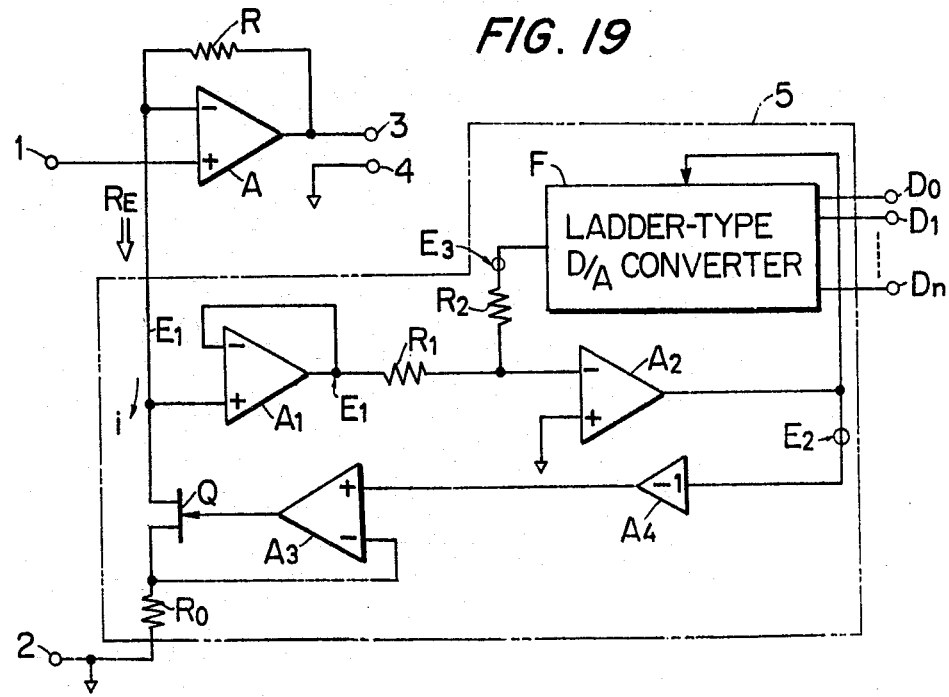
FIGS. 19 and 20 depict circuit diagrams of further illustrative embodiments of the invention showing hyperbolic type variable gain amplifiers.
Figure 20:
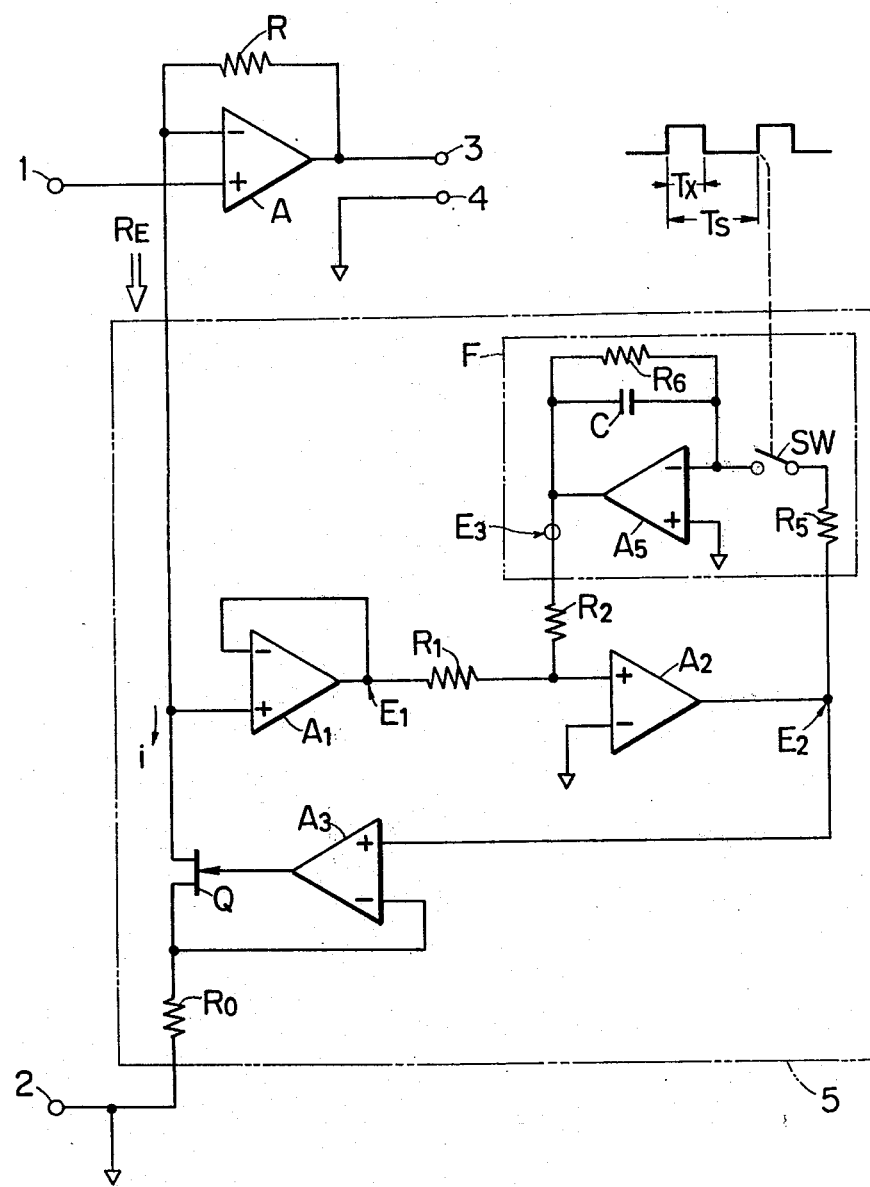

By associating the circuits as in FIGS. 2 or 5, the invention makes it possible to realize an amplifier circuit whose gain can be varied hyperbolically by a digital code signal or a pulse-width signal. Examples of these are schematically shown in FIGS. 19 and 20. The gains thereof are determined by $$G = \frac{R}{R_E} = 2\frac{R}{R_o} \cdot \frac{R_2}{R_1(D_o 2^o + D_1 2^{-1} + \ldots + D_n 2^{-n})} \tag{27}$$

$$G = \frac{R}{R_E} = \frac{R R_2 R_5}{R_o R_1 R_6} \cdot \frac{Ts}{Tx} \tag{28}$$

While preferred embodiments of the invention and particular modifications thereof have been described, it is to be understood that the invention is not limited to the disclosed examples but numerous variations may occur to those skilled in the art without departing from the spirit of the invention.

What is claimed is:

1. A variable resistance circuit comprising: a field effect transistor having drain, source and gate electrodes; a terminal connected to one of said drain or said source of said field effect transistor; an amplifier having a feedback circuit including a multiplier; a differential amplifier having a first and second input and an output; said terminal being connected to said first input through said amplifier; the other one of said source or said drain of said field effect transistor being connected to said second input; said gate of said field effect transistor being connected to said output; and a reference resistor connected between said other one of said source or said drain and a common potential point; wherein an equivalent resistance present between said terminal and said common potential point is selectively utilized.

2. The circuit of claim 1, wherein said multiplier is controlled by a digital code signal.

3. The circuit of claim 1, wherein said multiplier is controlled by a pulse-width signal.

4. A variable resistance circuit comprising: a field effect transistor having drain, source and gate electrodes; a terminal connected to one of said drain or said source of said field effect transistor; a multiplier; a differential amplifier having a first input and a second input and an output; said terminal being connected to said first input through to said multiplier; the other one of said source or said drain of said field effect transistor being connected to said second input; said gate of said field effect transistor being connected to said output; and a reference resistor connected between said other one of said source or said drain of said field effect transistor and a common potential point; wherein an equivalent resistance present between said terminal and said common potential point is selectively used.

5. The circuit of claim 4, wherein said multiplier is controlled by a digital code signal.

6. The circuit of claim 4, wherein said multiplier is controlled by a pulse-width signal.

7. A variable resistance circuit comprising: a transistor having base, collector and emitter electrodes; a first differential amplifier having two inputs and an output; a feedback circuit for said first differential amplifier including a multiplier; said collector electrode connected to one of said inputs of said first differential amplifier; a second differential amplifier having two inputs and an output; said output of said first differential amplifier connected to one of said inputs of said second differential amplifier; the other input of said second differential amplifier connected to said emitter electrode of said transistor; a field effect transistor having gate, source and drain electrodes; said output of said second differential amplifier connected to said gate electrode of said field effect transistor; one of said drain or said source electrode connected to said collector of said transistor; the other one of said drain and source electrode being connected to said base electrode of said transistor and branched through a resistor to said emitter electrode; and a reference resistor connected between said emitter electrode and a common potential point; wherein an equivalent resistance present between the collector electrode and said common potential point is selectively utilized.

8. A variable resistance circuit comprising: a transistor having base, collector and emitter electrodes; a multiplier having an input and an output; the input of said multiplier connected to said collector electrode; a differential amplifier having two inputs and an output; said output of said multiplier connected to one of said inputs of said differential amplifier; said emitter being connected to the other input of said differential amplifier; a field effect transistor having gate, source and drain electrodes; said gate electrode connected to said output of said differential amplifier; one of said drain or said source electrode connected to said collector of said transistor; and the other one of said source or said drain electrode connected to said base electrode of said transistor and branched through a resistor to said emitter electrode; and a reference resistor connected between said emitter electrode and a common potential point; wherein an equivalent resistance present between said collector electrode of said transistor and said common potential point is selectively utilized.

9. A variable gain DC amplifier circuit in a DC amplifier circuit having its output fed back through a resistor to its input, which is connected through a variable resistor to a common potential point, comprising: a field effect transistor having gate, drain and source electrodes; a multiplier having input and output; one of said drain electrode or said source electrode of said field effect transistor connected to said input of said multiplier; a differential amplifier having two inputs and an output; said output of said multiplier connected to one input of said differential amplifier; the other one of said source or said drain electrode of said field effect transistor being connected to said other input of said differential amplifier and said gate electrode of said field effect transistor connected to said output of said differential amplifier; a reference resistor connected serially to said other one of said drain or said source electrode of said field effect transistor; wherein an equivalent resistance present between said drain and said source electrodes of said field effect transistor and said reference resistor is selectively utilized for said variable resistor.

10. A variable gain DC amplifier circuit in a DC amplifier circuit having its output fed back through a resistor to its input, which is connected through a variable resistor to a common potential point; comprising: a field effect transistor having gate, drain and source electrodes; a first differential amplifier having two inputs and an output; a feedback circuit for said first differential amplifier comprising a multiplier; one of said drain or said source electrode connected to one of said inputs of said first differential amplifier; a second differential amplifier having two inputs and an output; said output of said first differential amplifier connected to one of said inputs of said second differential amplifier; the other one of said source or said drain electrode connected to the other input of said second differential amplifier; said output of said second differential amplifier connected to said gate electrode; and a reference resistor connected serially to said other one of said drain of said gate electrode wherein an equivalent resistance present between said drain and said source electrodes of said field effect transistor and said reference resistor is selectively utilized for said variable resistor.

* * * * *